United States Patent [19]
Shimomura

[11] Patent Number: 6,150,886
[45] Date of Patent: Nov. 21, 2000

[54] PHASE LOCKED LOOP CIRCUIT WITH MULTIPLE COMBINATIONS WHICH EACH PRODUCE A SINGLE PHASE AND MULTIPHASE CLOCK SIGNALS

[75] Inventor: Takehiko Shimomura, Tokyo, Japan

[73] Assignee: Mitsubishi Denki Kabushiki Kaisha, Tokyo, Japan

[21] Appl. No.: 09/266,793

[22] Filed: Mar. 12, 1999

[30] Foreign Application Priority Data

Oct. 20, 1998 [JP] Japan .................................. 10-298494

[51] Int. Cl.[7] ............................... H03L 7/07; H03L 7/18; H03L 7/23
[52] U.S. Cl. .................................... 331/2; 331/45
[58] Field of Search ........................................... 331/2, 45

[56] References Cited

U.S. PATENT DOCUMENTS

| | | | |
|---|---|---|---|
| 4,833,425 | 5/1989 | Culican, Sr. et al. ...................... | 331/2 |
| 4,904,955 | 2/1990 | Ley ............................................. | 331/2 |
| 5,270,669 | 12/1993 | Jokura ......................................... | 331/2 |
| 5,642,039 | 6/1997 | Bradley et al. ............................... | 331/2 |
| 5,748,044 | 5/1998 | Xue ............................................. | 331/2 |

FOREIGN PATENT DOCUMENTS

| | | |
|---|---|---|
| 1-106525 | 4/1989 | Japan . |
| 2-234515 | 9/1990 | Japan . |
| 9-284126 | 10/1997 | Japan . |

*Primary Examiner*—Siegfried H. Grimm
*Attorney, Agent, or Firm*—Burns, Doane, Swecker & Mathis, LLP

[57] ABSTRACT

A PLL circuit including multiple sets of phase locked loops, each of which has a phase comparator, a charge pump, a low pass filter, as oscillator, a clock generator and a frequency divider. The various oscillators of the multiple sets each have a different oscillation frequency. The clock generator generates a multiphase clock signal from a single phase clock signal generated by the oscillator. The PLL circuit generates multiple single phase clock signals and multiphase clock signals without need to tune the oscillation frequency of the VCOs over a wide range. The noise of the PLL is reduced since each VCO covers a smaller range of oscillation frequencies.

11 Claims, 8 Drawing Sheets

PHASE LOCKED LOOP CIRCUIT WITH MULTIPLE COMBINATIONS WHICH EACH PRODUCE A SINGLE PHASE AND MULTIPHASE CLOCK SIGNALS

BACKGROUND OF THE INVENTION

1. Field of the Invention

The present invention relates to a PLL (Phase Locked Loop) circuit embedded in a semiconductor integrated circuit requiring a high speed system clock to generate a plurality of single phase clock signals and multiphase clock signals with different frequencies.

2. Description of Related Art

FIG. 6 is a block diagram showing a conventional PLL circuit. In FIG. 6, the reference numeral 1 designates a phase comparator that compares the phase of a clock signal EC supplied to the PLL circuit (which will be referred to as an "external clock signal EC" from now on) with the phase of a frequency divided clock signal DC output from a frequency divider 6 (which will be referred to as a "frequency divided clock signal" below), and controls a pulse width of a pulse signal PA to be supplied to a charge pump 2 in accordance with the compared result; 2 designates the charge pump that adjusts the control voltage of a VCO (Voltage Controlled Oscillator) 4 in response to the width of the pulse signal supplied from the phase comparator 1; and 3 designates a low-pass filter (LPF) for eliminating harmonic noise contained in the control voltage of the VCO 4.

The reference numeral 4 designates the VCO for oscillating a clock signal CL with a frequency corresponding to the control voltage supplied from the charge pump 2 through the LPF 3 (which will be referred to as a "single phase clock signal" from now on); 5 designates a clock generator that generates a multiphase clock signal MCL from the single phase clock signal CL generated by the VCO 4, and outputs at least one of the single phase clock signal CL and multiphase clock signal MCL; and 6 designates the frequency divider that divides the frequency of the single phase clock signal CL oscillated by the VCO 4, and supplies the frequency divided clock signal DC to the phase comparator 1.

Next, the operation of the conventional PLL circuit will be described.

First, the phase comparator 1 of the PLL circuit compares the phase of the external clock signal EC with that of the frequency divided clock signal DC output from the frequency divider 6 to synchronize the single phase clock signal CL and the multiphase clock signal MCL with the external clock signal EC supplied to the PLL circuit.

If the phases of the two clock signals compared agree with each other, the phase comparator 1 suppresses the output of the pulse signal to be supplied to the charge pump 2, but if they disagree, the phase comparator 1 outputs the pulse signal with a width corresponding to the phase difference.

The pulse signal supplied to the charge pump 2 consists of two types of pulse signals, one for reducing the control voltage of the VCO 4, and the other for increasing it. More specifically, if the phase of the frequency divided clock signal DC lags behind the phase of the external clock signal EC, the pulse width of the pulse signal for increasing the control voltage of the VCO 4 is increased to advance the phase of the frequency divided clock signal DC. In contrast, if the phase of the frequency divided clock signal DC leads the phase of the external clock signal EC, the pulse width of the pulse signal for reducing the control voltage of the VCO 4 is increased to delay the phase of the frequency divided clock signal DC.

In response to one of the two types of the pulse signals supplied from the phase comparator 1, the charge pump 2 controls the control voltage of the VCO 4: the charge pump 2 increases the control voltage with the increase of the pulse width of the pulse signal for increasing the control voltage; and decreases the control voltage with the increase of the pulse width of the pulse signal for reducing the control voltage.

The LPF 3 removes the harmonic noise contained in the control voltage of the VCO 4 to reduce fluctuations in the control voltage by weakening the effect of the noise externally superimposed thereon, and supplies the VCO 4 with the control voltage with its noise removed.

Receiving the control voltage thus supplied from the LPF 3, the VCO 4 generates the single phase clock signal CL with the frequency corresponding to the control voltage. If the PLL circuit must generate a plurality of single phase clock signals and multiphase clock signals with different frequencies, the oscillation frequency of the VCO 4 must cover from a low to high frequency range. Thus, the oscillation frequency of the VCO 4 must be tuned over a wide range. FIG. 7 illustrates an example in which the oscillation frequency of the VCO 4 is tuned from 20 MHz to 100 MHz.

In response to the single phase clock signal CL generated by the VCO 4, the clock generator 5 generates the multiphase clock signal MCL, and outputs at least one of the single phase clock signal CL and multiphase clock signal MCL. When the PLL circuit must output the frequency divided clock signal DC of the single phase clock signal CL to the outside, the clock generator 5 includes a frequency divider for producing the frequency divided clock signal DC from the single phase clock signal CL to be supplied to the outside.

The frequency divider 6 supplies the phase comparator 1 with the frequency divided clock signal DC by dividing the frequency of the single phase clock signal CL generated by the VCO 4 to synchronize the single phase clock signal CL and multiphase clock signal MCL with the external clock signal EC.

Besides the foregoing prior art, Japanese patent application laid-open No. 2-234515/1990 discloses a technique that installs a plurality of VCOs in a PLL circuit. This technique, however, installs the plurality of VCOs to obtain an optimum loop noise band, but not to obtain a plurality of single phase clock signals or the like with different frequencies.

Although the conventional PLL circuit can output a plurality of single phase and multiphase clock signals with different frequencies with the foregoing configuration, it is not easy for the PLL circuit to tune the oscillation frequency of the VCO 4 over a wide range. In particular, the conventional PLL circuit has a problem in that it cannot increase the frequency of the single phase clock signal without deteriorating its frequency accuracy, because the tuning becomes increasingly difficult in a high frequency range.

Even if the oscillation frequency of the VCO 4 can be tuned over a wide range, the fluctuations in the oscillation frequency will become pronounced if the control voltage of the VCO 4 varies owing to noise or the like. Thus, a semiconductor integrated circuit using such a single phase clock signal as its system clock signal (a microcomputer embedded in a semiconductor integrated circuit, for example) is in danger of a malfunction.

SUMMARY OF THE INVENTION

The present invention is implemented to solve the foregoing problem. It is therefore an object of the present invention to provide a PLL circuit which can facilitate the tuning of the oscillation frequency, and is insusceptible to noise.

According to a first aspect of the present invention, there is provided a PLL circuit comprising a plurality of combinations, each of the combinations comprising: adjusting means for comparing a phase of an external clock signal with a phase of a frequency divided clock signal, and for adjusting a control voltage in accordance with a phase difference between the two signals compared; an oscillator for oscillating a clock signal with a frequency corresponding to the control voltage; and a frequency divider for dividing a frequency of the clock signal generated by the oscillator to produce the frequency divided clock signal to be supplied to the adjusting means, wherein the oscillator in each of the plurality of combinations has a different oscillation frequency.

Here, each of the plurality of combinations may further comprise a clock generator for generating one or more other clock signals from the clock signal.

The adjusting means in each of the plurality of combinations may comprise a low-pass filter for removing noise from the control voltage.

According to a second aspect of the present invention, there is provided a PLL circuit comprising: first adjusting means for comparing a phase of an external clock signal with a phase of a first frequency divided clock signal, and for adjusting a first control voltage in accordance with a phase difference between the two signals compared; a first oscillator for oscillating a first clock signal with a frequency corresponding to the first control voltage; a first frequency divider for dividing the frequency of the first clock signal generated by the first oscillator to produce the first frequency divided clock signal to be supplied to the first adjusting means; second adjusting means for comparing a phase of the first clock signal supplied from the first oscillator with a phase of a second frequency divided clock signal, and for adjusting a second control voltage in accordance with a phase difference between the two signals compared; a second oscillator for oscillating a second clock signal with a frequency corresponding to the second control voltage; and a second frequency divider for dividing the frequency of the second clock signal generated by the second oscillator to produce the second frequency divided clock signal to be supplied to the second adjusting means, wherein the first oscillator and the second oscillator have a different oscillation frequency.

Here, the PLL circuit may further comprise one or more combinations, wherein each of the one or more combinations comprises adjusting means, an oscillator and a frequency divider equivalent to the second adjusting means, the second oscillator and second frequency divider, respectively, except that oscillators in the one or more combinations have an oscillation frequency different from each other and different from the oscillation frequencies of the first oscillator and the second oscillator.

According to a third aspect of the present invention, there is provided a PLL circuit comprising: adjusting means for comparing a phase of an external clock signal with a phase of a frequency divided clock signal, and for adjusting a control voltage in accordance with a phase difference between the two signals compared; a first oscillator for oscillating a first clock signal with a frequency corresponding to the control voltage; a second oscillator for oscillating a second clock signal with a frequency corresponding to the control voltage but different from an oscillation frequency of the first oscillator; and a frequency divider for dividing the frequency of the first clock signal generated by the first oscillator to produce the frequency divided clock signal to be supplied to the adjusting means.

Here, the PLL circuit may further comprise one or more oscillators, each of which is equivalent to the second oscillator except that the first oscillator, the second oscillator and the one or more oscillators have a different oscillation frequency from each other.

The oscillation frequency of the first oscillator may be tuned to 2N times that of the second oscillator, where N is an integer.

The oscillation frequency of the second oscillator may be tuned to 2N times that of the first oscillator, where N is an integer.

DETAILED DESCRIPTION OF THE PREFERRED EMBODIMENTS

The invention will now be described with reference to the accompanying drawings.

Embodiment 1

Figure 1A:
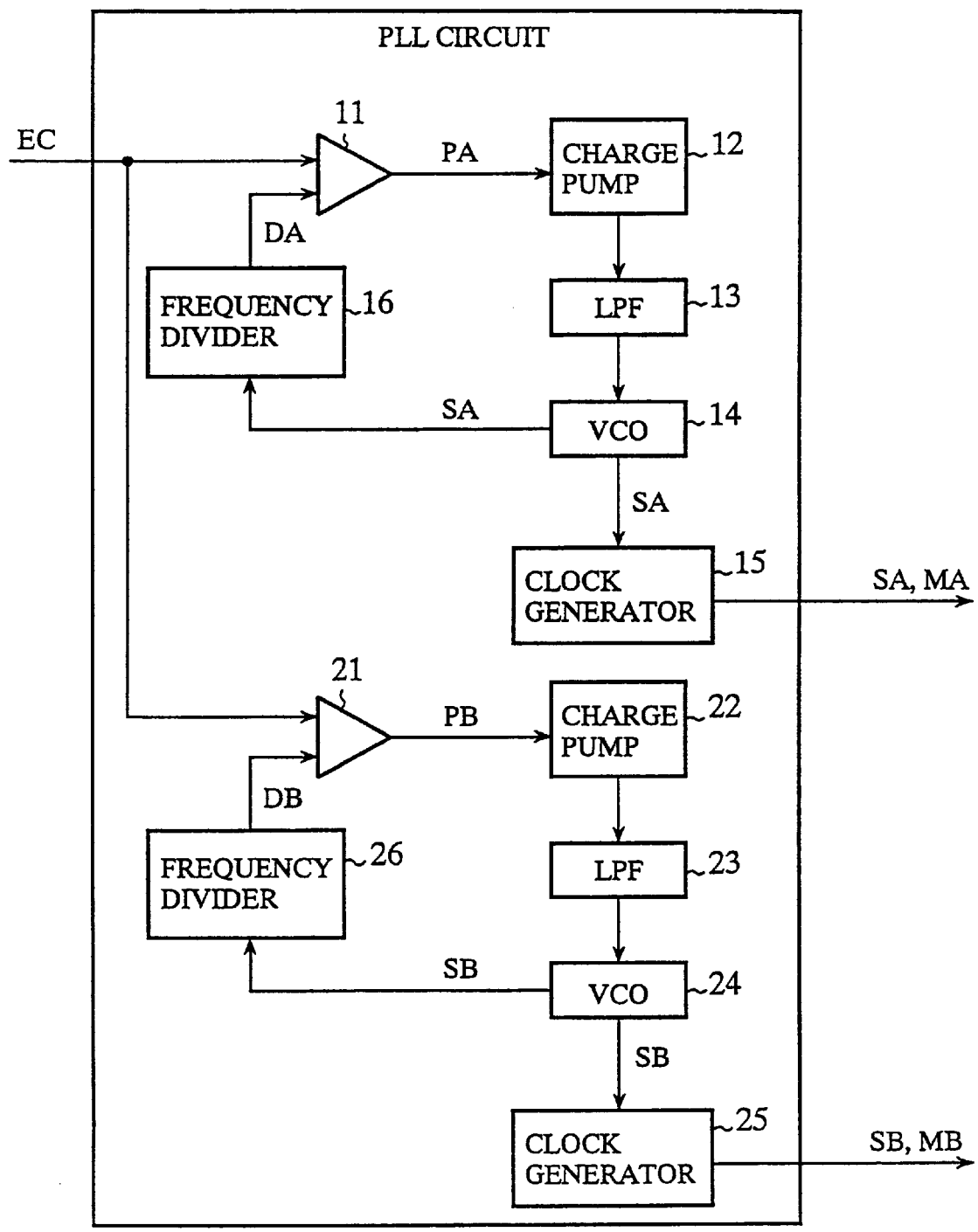
FIG. 1A is a block diagram showing a configuration of an embodiment 1 of a PLL circuit in accordance with the present invention.

FIG. 1A is a block diagram showing a configuration of an embodiment 1 of a PLL circuit in accordance with the present invention. In FIG. 1A, the reference numeral 11 designates a phase comparator that compares the phase of a clock signal EC supplied to the PLL circuit (which will be referred to as an "external clock signal EC" from now on) with the phase of a frequency divided clock signal DA produced from a frequency divider 16 (which will be referred to as a "frequency divided clock signal DA" below), and controls a pulse width of a pulse signal PA to be supplied to a charge pump 12 in accordance with the compared result; 12 designates the charge pump that adjusts the control voltage of a VCO 14 in response to the width of the pulse signal PA supplied from the phase comparator 11; and 13 designates a low-pass filter (LPF) for eliminating harmonic noise contained in the control voltage of the VCO 14.

The reference numeral 14 designates the VCO for oscillating a clock signal SA (which will be referred to as a "single phase clock signal SA" from now on) with a frequency corresponding to the control voltage supplied from the charge pump 12 through the LPF 13; 15 designates a clock generator that generates a multiphase clock signal MA from the single phase clock signal SA generated by the VCO 14, and outputs at least one of the single phase clock signal SA and multiphase clock signal MA; and 16 designates the frequency divider that divides the frequency of the single phase clock signal SA oscillated by the VCO 14, and supplies the frequency divided clock signal DA to the phase comparator 11.

Likewise, the reference numeral 21 designates a phase comparator that compares the phase of the clock signal EC supplied to the PLL circuit with the phase of a frequency divided clock signal DB output from a frequency divider 26, and controls a pulse width of a pulse signal PB to be supplied to a charge pump 22 in accordance with the compared result; 22 designates the charge pump that adjusts the control voltage of a VCO 24 in accordance with the width of the pulse signal PB supplied from the phase comparator 21; and 23 designates a low-pass filter (LPF) for eliminating harmonic noise contained in the control voltage of the VCO 24.

The reference numeral 24 designates the VCO for oscillating a clock signal (which will be referred to as a "single phase clock signal SB" from now on) with a frequency corresponding to the control voltage supplied from the charge pump 22 through the LPF 23; 25 designates a clock generator that generates a multiphase clock signal MB from the single phase clock signal SB generated by the VCO 24, and outputs at least one of the single phase clock signal SB and multiphase clock signal MB; and 26 designates the frequency divider that divides the frequency of the single phase clock signal SB oscillated by the VCO 24, and supplies it to the phase comparator 21.

Next, the operation of the present embodiment 1 will be described.

In the present embodiment 1, the PLL circuit will be described which can output the single phase clock signal SA with a frequency of 40 MHz, and the single phase clock signal SB with a frequency of 80 MHz.

First, the phase comparator 11 of the PLL circuit compares the phase of the external clock signal EC with that of the frequency divided clock signal DA output from the frequency divider 16, to synchronize the single phase clock signal SA and multiphase clock signal MA with the external clock signal EC supplied to the PLL circuit.

If the phases of the two clock signals compared agree with each other, the phase comparator 11 suppresses the output of the pulse signal PA to be supplied to the charge pump 12, but if they disagree, the phase comparator 11 outputs the pulse signal PA with a width corresponding to the phase difference.

The pulse signal PA supplied to the charge pump 12 consists of two types of pulse signals, one for reducing the control voltage of the VCO 14, and the other for increasing it. More specifically, if the phase of the frequency divided clock signal DA lags behind the phase of the external clock signal EC, the pulse width of the pulse signal for increasing the control voltage of the VCO 14 is increased to advance the phase of the frequency divided clock signal DA. On the contrary, if the phase of the frequency divided clock signal DA leads the phase of the external clock signal EC, the pulse width of the pulse signal for reducing the control voltage of the VCO 14 is increased to delay the phase of the frequency divided clock signal DA.

In response to one of the two types of the pulse signals PA supplied from the phase comparator 11, the charge pump 12 controls the control voltage of the VCO 14: the charge pump 12 increases the control voltage with the increase of the pulse width of the pulse signal for increasing the control voltage; and decreases the control voltage with the increase of the pulse width of the pulse signal for reducing the control voltage.

The LPF 13 removes the harmonic noise contained in the control voltage of the VCO 14 to reduce fluctuations of the control voltage by weakening the effect of the noise externally superimposed thereon, and supplies the VCO 14 with the control voltage with its noise removed.

Figure 2:
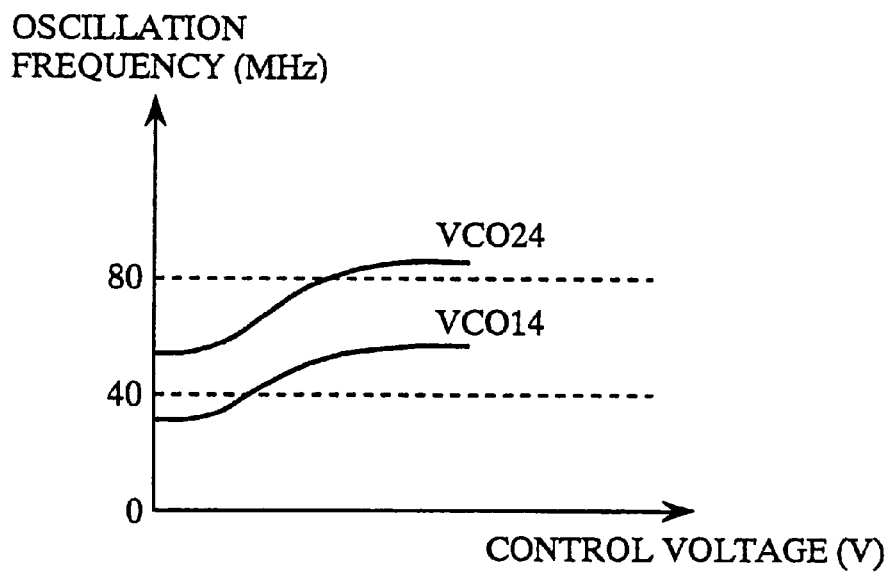
FIG. 2 is a diagram illustrating oscillation frequency characteristics of VCOs of the embodiment 1.

Receiving the control voltage thus supplied from the LPF 13, the VCO 14 generates the single phase clock signal SA with the frequency corresponding to the control voltage. The oscillation frequency of the VCO 14 is tuned to 40 MHz (see, FIG. 2). The tuning of the oscillation frequency is carried out using transistors constituting the VCO 14.

In response to the single phase clock signal SA generated by the VCO 14, the clock generator 15 generates the multiphase clock signal MA, and outputs at least one of them. When the PLL circuit must output the frequency divided clock signal DA of the single phase clock signal SA to the outside, the clock generator 15 includes a frequency divider for producing the frequency divided clock signal DA from the single phase clock signal SA to be supplied to the outside.

The frequency divider 16 supplies the phase comparator 11 with the frequency divided clock signal DA by dividing the frequency of the single phase clock signal SA generated by the VCO 14 in order to synchronize the single phase clock signal SA and multiphase clock signal MA with the external clock signal EC.

Likewise, the phase comparator 21 of the PLL circuit compares the phase of the external clock signal EC with that of the frequency divided clock signal DB output from the frequency divider 26, to synchronize the single phase clock signal SB and multiphase clock signal MB with the external clock signal EC supplied to the PLL circuit.

The pulse signal PB supplied to the charge pump 12 consists of two types of pulse signals, one for reducing the control voltage of the VCO 24, and the other for increasing it.

If the phases of the two clock signals compared agree with each other, the phase comparator 21 suppresses the output of the pulse signal PB to be supplied to the charge pump 22, but if they disagree, the phase comparator 21 outputs the pulse signal PB with a width corresponding to the phase difference.

More specifically, if the phase of the frequency divided clock signal DB lags behind the phase of the external clock signal EC, the pulse width of the pulse signal for increasing the control voltage of the VCO 14 is increased to advance the phase of the frequency divided clock signal DB. In contrast, if the phase of the frequency divided clock signal DB leads the phase of the external clock signal EC, the pulse width of the pulse signal for reducing the control voltage of the VCO 24 is increased to delay the phase of the frequency divided clock signal DB.

In response to the pulse width of the pulse signal PB supplied from the phase comparator 21, the charge pump 22 controls the control voltage of the VCO 24: the charge pump 22 increases the control voltage with the increase of the pulse width of the pulse signal for increasing the control voltage; and decreases the control voltage with the increase of the pulse width of the pulse signal for reducing the control voltage.

The LPF 23 removes the harmonic noise contained in the control voltage of the VCO 24 to reduce fluctuations of the control voltage by weakening the effect of the noise externally superimposed thereon, and supplies the VCO 24 with the control voltage with its noise removed.

Receiving the control voltage thus supplied from the LPF 23, the VCO 24 generates the single phase clock signal SB with the frequency corresponding to the control voltage. The oscillation frequency of the VCO 24 is tuned to 80 MHz (see, FIG. 2). The tuning of the oscillation frequency is carried out using transistors constituting the VCO 24.

In response to the single phase clock signal SB generated by the VCO 24, the clock generator 25 generates the multiphase clock signal MB, and outputs at least one of them. When the PLL circuit must output the frequency divided clock signal DB of the single phase clock signal SB to the outside, the clock generator 25 includes a frequency divider for producing the frequency divided clock signal DB from the single phase clock signal SB, and supplying it to the outside.

The frequency divider 26 supplies the phase comparator 21 with the frequency divided clock signal DB by dividing the frequency of the single phase clock signal SB generated by the VCO 24, to synchronize the single phase clock signal SB and multiphase clock signal MB with the external clock signal EC.

According to the present embodiment 1, a plurality of VCOs with different oscillation frequencies are installed in addition to a plurality of phase comparators, charge pumps, LPFs, clock generators and frequency dividers. This makes it possible for the PLL circuit to generate the plurality of single phase clock signals and multiphase clock signals to the outside without tuning the oscillation frequency of the VCOs 14 and 24 over a wide range. This offers an advantage of being able to facilitate the tuning of the oscillation frequency of the VCOs.

In addition, it is enough for the VCOs 14 and 24 to cover only particular oscillation frequencies, which has an advantage of being able to provide a PLL circuit insusceptible to noise or the like.

Embodiment 2

Although the foregoing embodiment 1 includes the LPFs 13 and 23 in the PLL circuit, they can be provided externally without losing the effect of the embodiment 1.

Figure 1B:
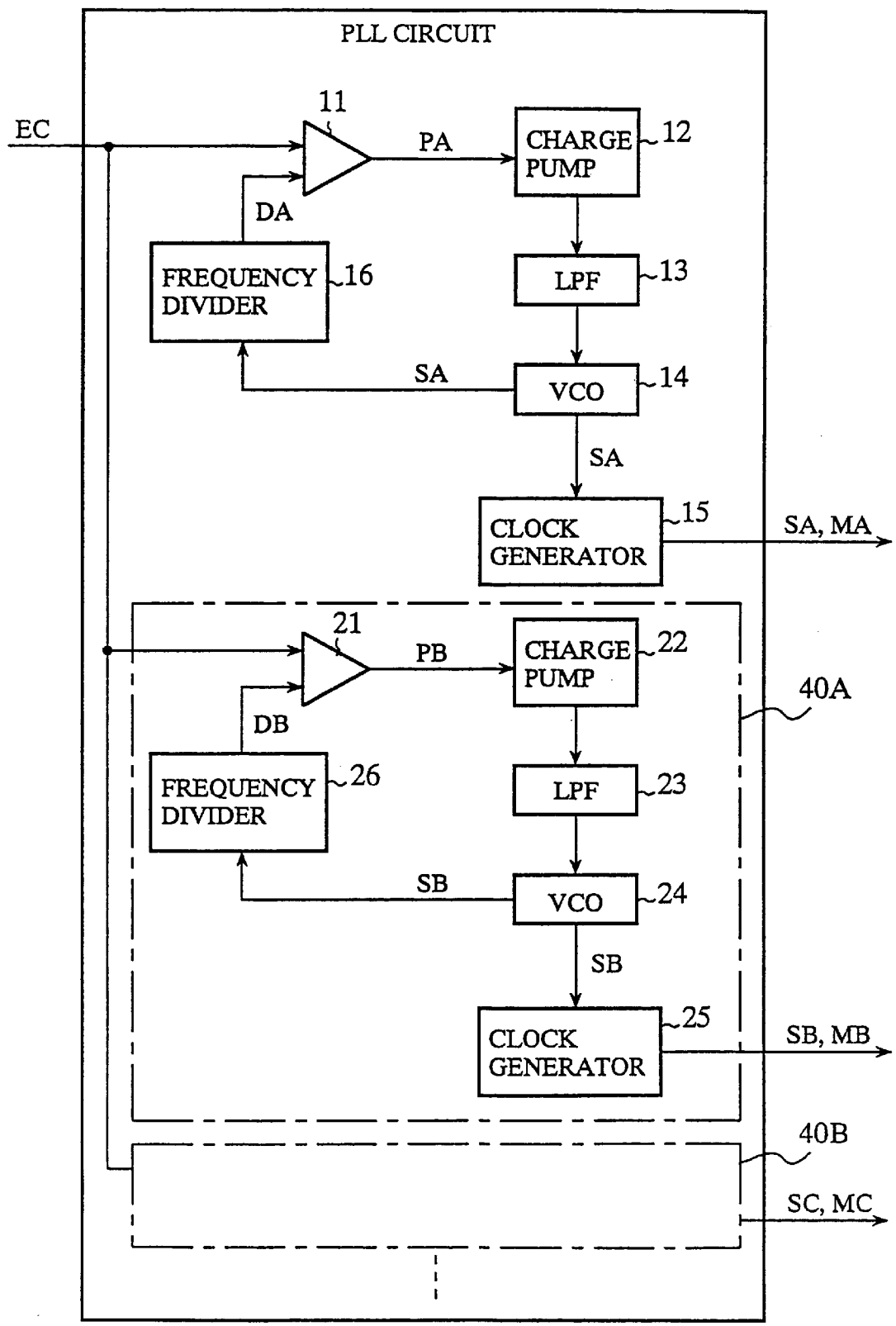
FIG. 1B is a block diagram showing a configuration of an embodiment 2 of the PLL circuit in accordance with the present invention.

Furthermore, although the foregoing embodiment 1 includes a pair of VCOs and other components, the number of these components is not limited to two. They can be provided three or more each as shown in FIG. 1B, in which the reference numerals 40A and 40B designate blocks of the same structure except that their VCOs have a different oscillation frequency.

Embodiment 3

Figure 3A:
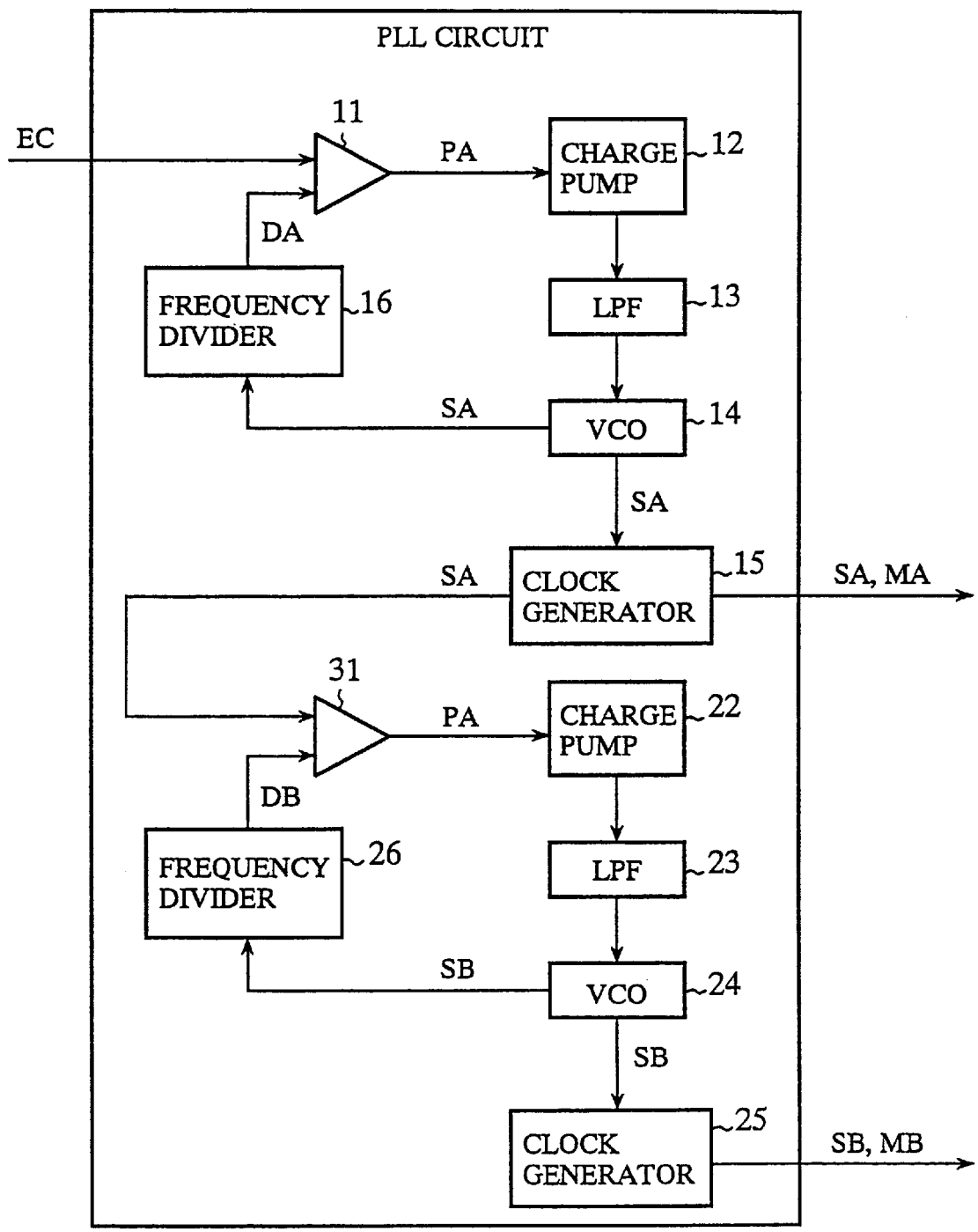
FIG. 3A is a block diagram showing a configuration of an embodiment 3 of the PLL circuit in accordance with the present invention.

FIG. 3A is a block diagram showing an embodiment 3 of the PLL circuit in accordance with the present invention, in which the same reference numerals designate the same or like portions to those of FIG. 1A, and hence the description thereof is omitted here.

In FIG. 3A, the reference numeral 31 designates a phase comparator that compares the phase of the single phase clock signal SA generated by the clock generator 15 (or the VCO 14) with the phase of the clock signal DB output from the frequency divider 26, and controls the pulse width of the pulse signal PB to be supplied to the charge pump 22 in accordance with the compared result.

Next, the operation of the present embodiment 3 will be described.

Although the phase comparators 11 and 21 of the foregoing embodiment 1 receive the external clock signal EC as one of their inputs, this is not essential. For example, the phase comparator 31 can receive as one of its inputs the single phase clock signal SA generated by the clock generator 15 (or the VCO 14), achieving the same effect as the foregoing embodiment 1.

Embodiment 4

Figure 3B:
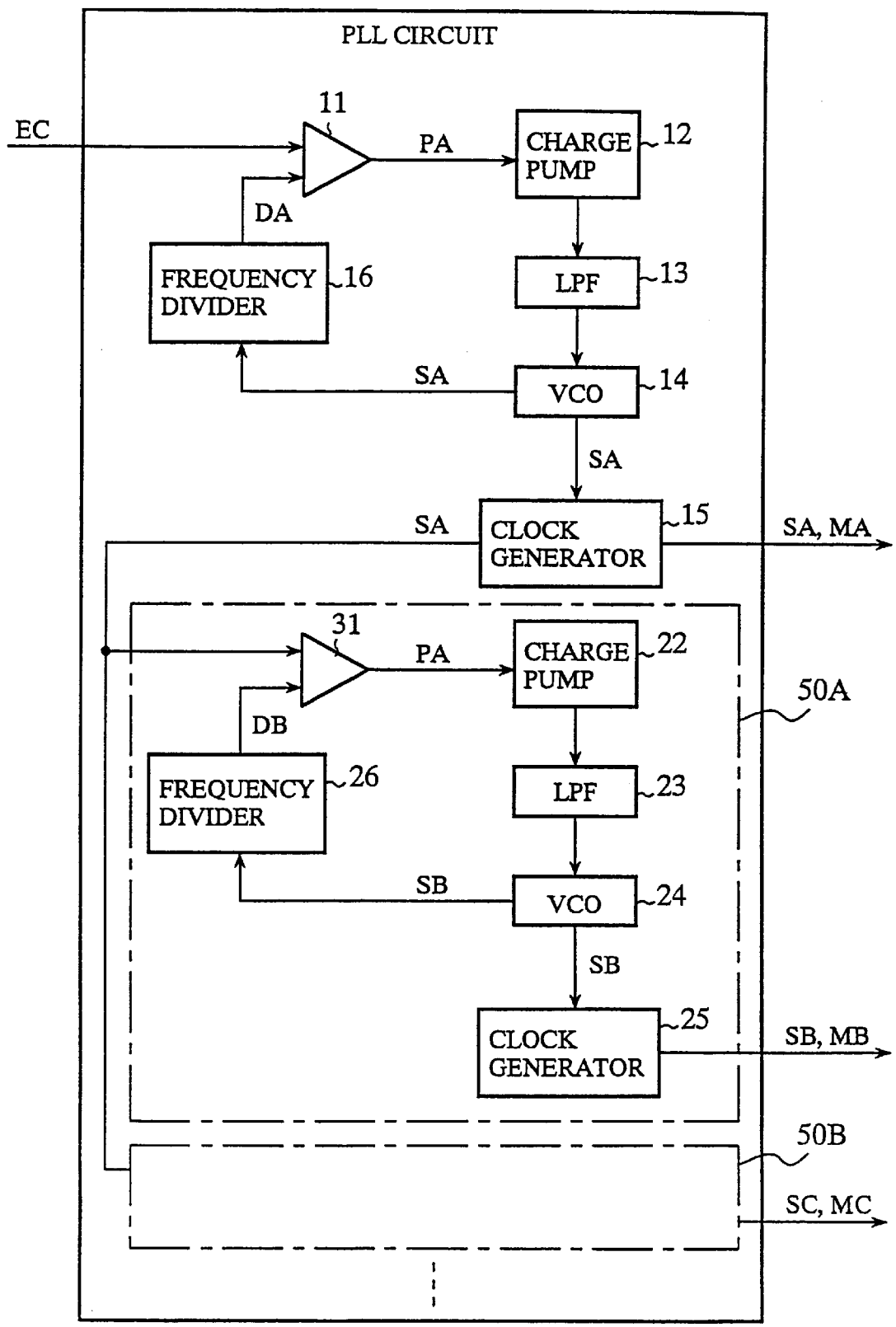
FIG. 3B is a block diagram showing a configuration of an embodiment 4 of the PLL circuit in accordance with the present invention.

Although the foregoing embodiment 3 includes single phase comparator 31, charge pump 22, LPF 23, VCO 24, clock generator 25 and frequency divider 26, two or more of them can be provided each as shown in FIG. 3B, in which the reference numerals 50A and 50B designate blocks of the same structure except that their VCOs have a different oscillation frequency.

Embodiment 5

Figure 4A:
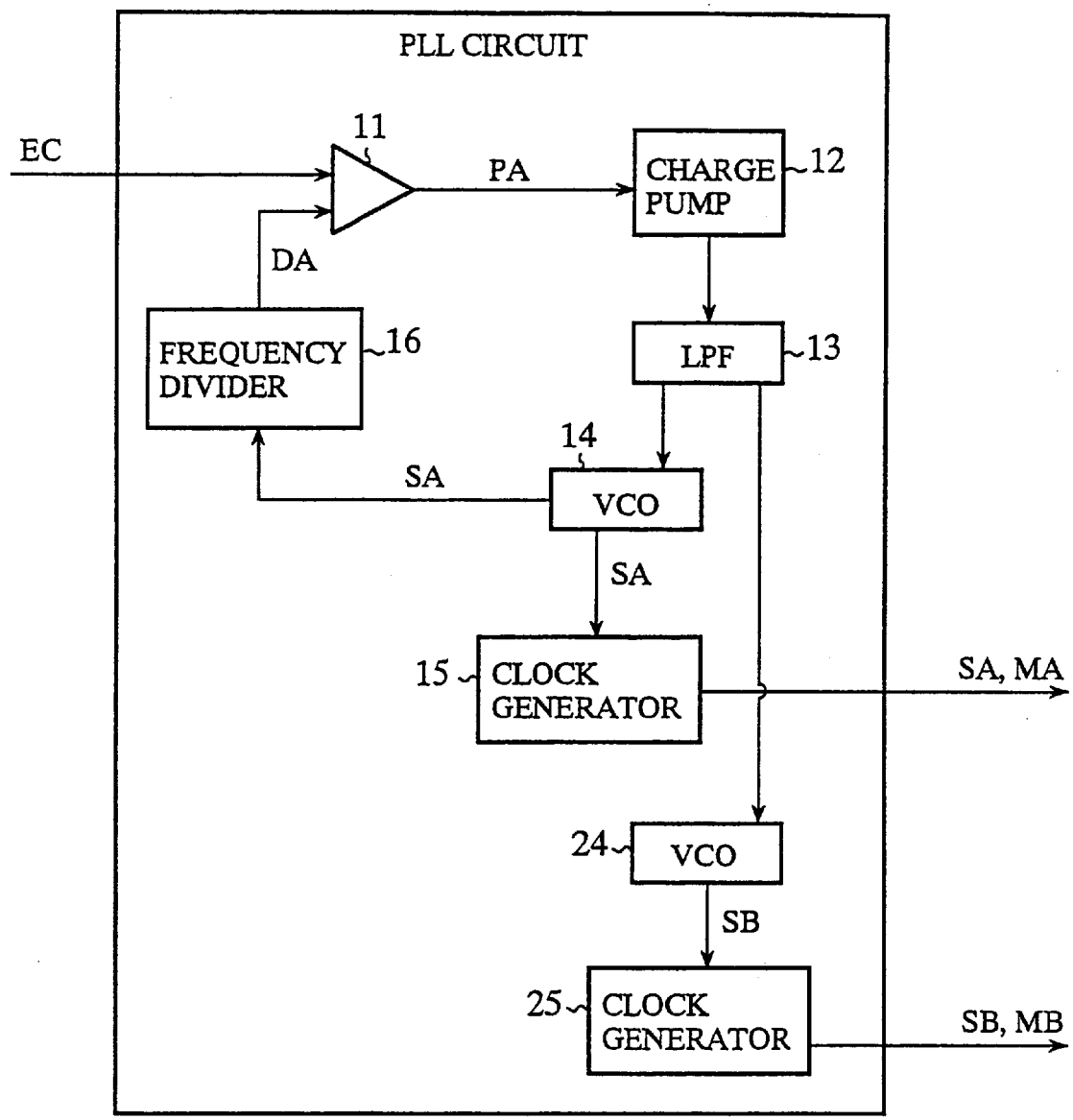
FIG. 4A is a block diagram showing a configuration of an embodiment 5 of the PLL circuit in accordance with the present invention.

Although the phase comparators, charge pumps, LPFs, clock generators, VCOs and frequency dividers are each paired in the foregoing embodiment 1, the phase comparator 11, charge pump 12, LPF 13 and frequency divider 16 can be shared as shown in FIG. 4A, so that only the VCOs and clock generators are paired, achieving the same effect as the foregoing embodiment 1.

To establish synchronization of the single phase clock signal SA and the multiphase clock signal MA with the single phase clock signal SB and the multiphase clock signal MB, however, it is necessary to tune the oscillation frequency of the VCO 24 to 2N times of the oscillation frequency of the VCO 14, where N is an integer.

Figure 5:
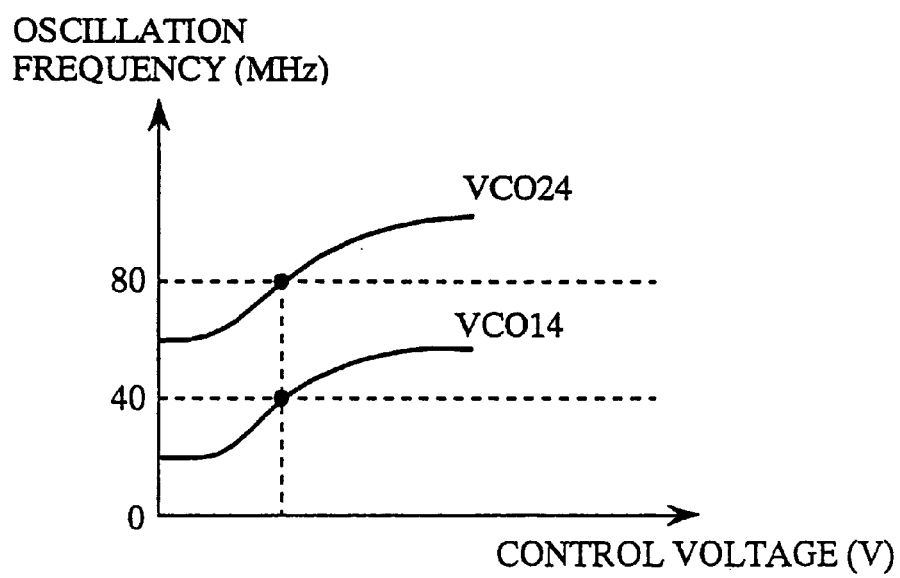
FIG. 5 is a diagram illustrating oscillation frequency characteristics of VCOs of the embodiment 5.

In the example of FIG. 5, the VCO 14 oscillates the single phase clock signal SA of 40 MHz, and the VCO 24 oscillates the single phase clock signal SB of 80 MHz.

By thus sharing the phase comparator 11, charge pump 12, LPF 13 and frequency divider 16, although the tuning of the VCOs becomes somewhat complicated as compared with that of the foregoing embodiment 1, it has an advantage of being able to reduce the circuit scale of the PLL circuit.

Embodiment 6

Figure 4B:
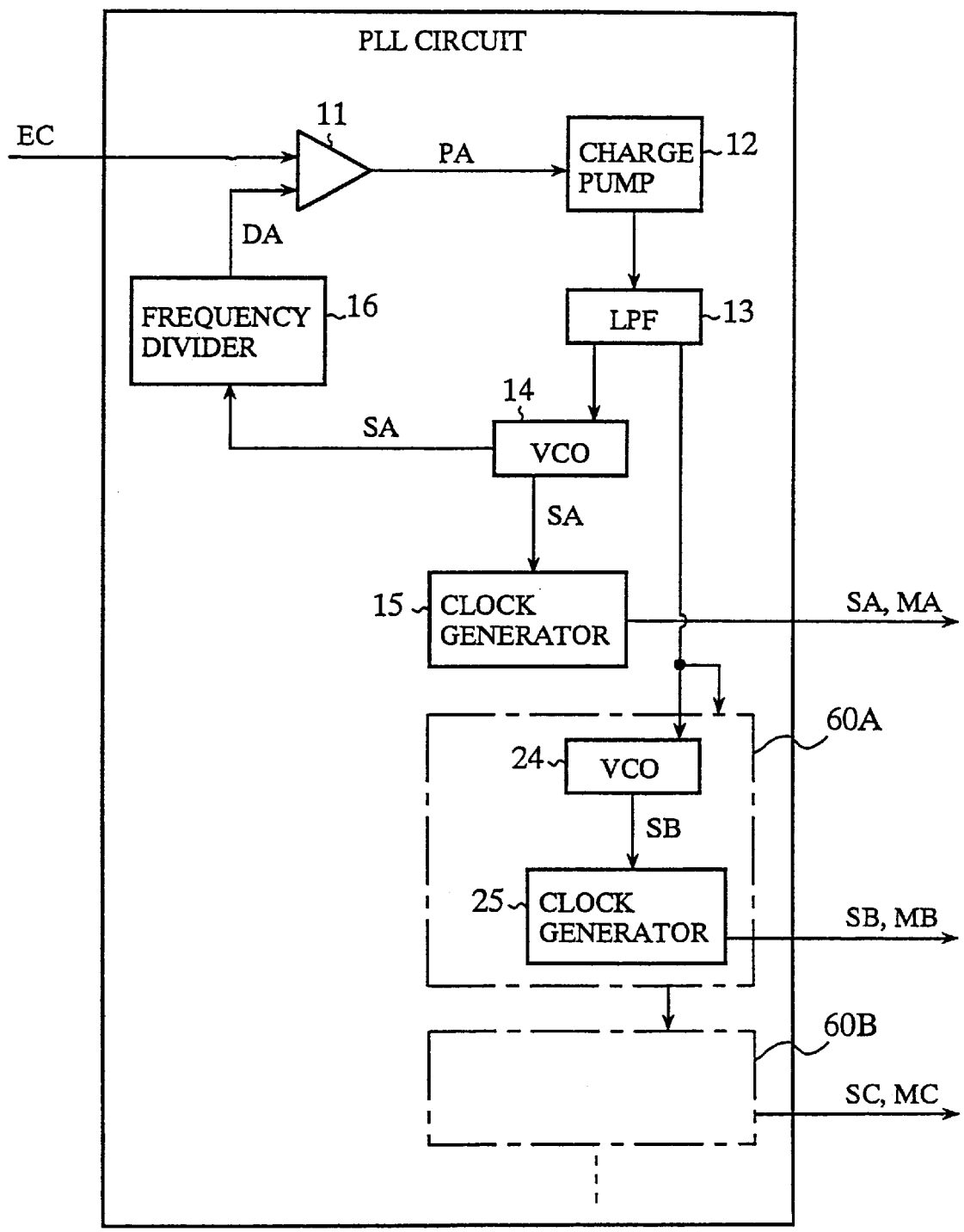
FIG. 4B is a block diagram showing a configuration of an embodiment 6 of the PLL circuit in accordance with the present invention.
Figure 6:
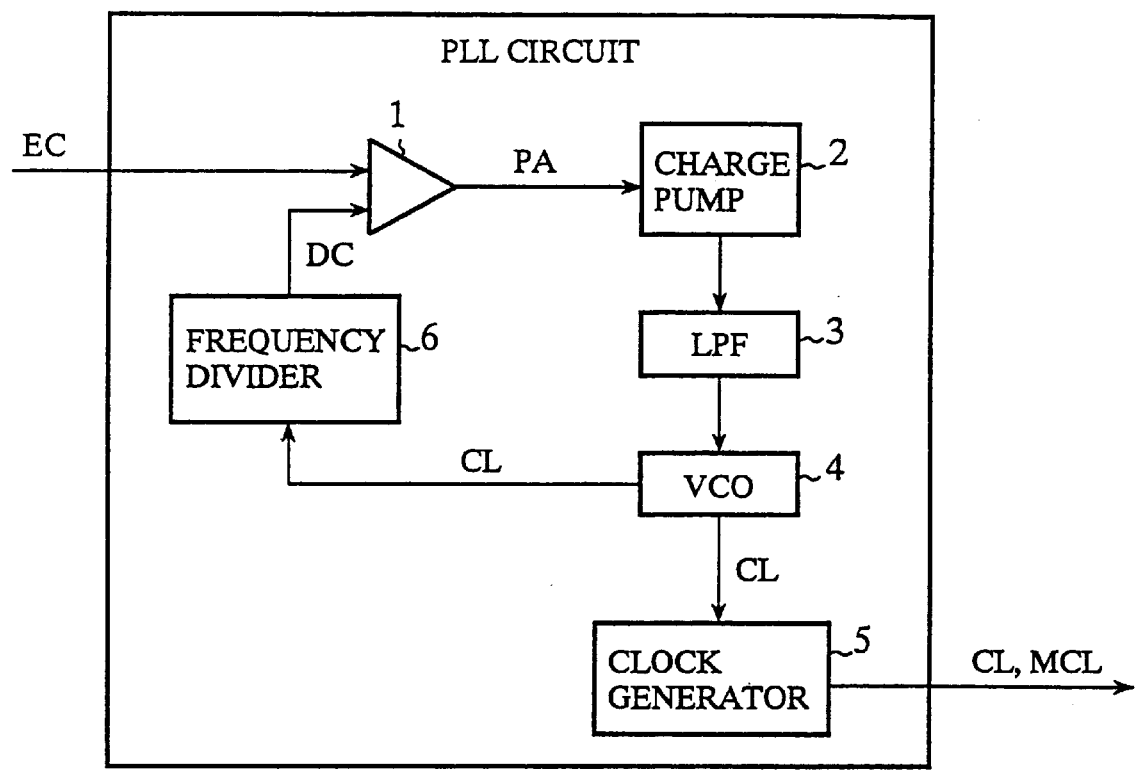
FIG. 6 is a block diagram showing a configuration of a conventional PLL circuit.
Figure 7:
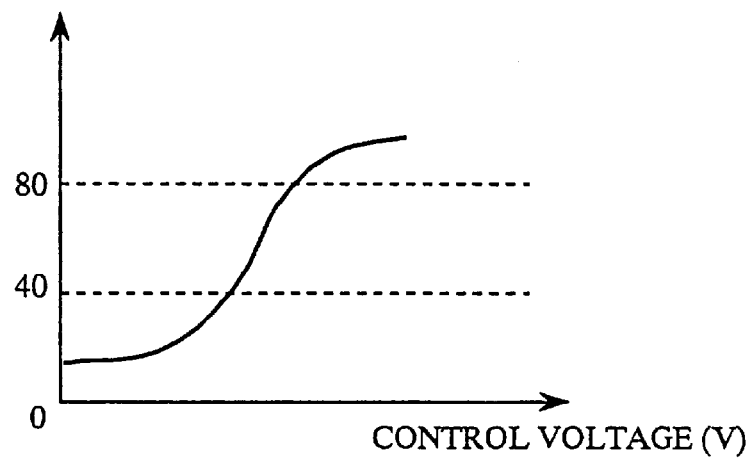
FIG. 7 is a diagram illustrating oscillation frequency characteristics of a VCO of the conventional PLL circuit.

Although a single combination of the VCO 24 and clock generator 25 is installed in the foregoing embodiment 5, it is obvious that two or more combinations of them can be equipped as shown in FIG. 4B, in which the reference numerals 60A and 60B designate blocks of the same structure except that their VCOs have a different oscillation frequency.

In addition, although the oscillation frequency of the VCO 24 is established at 2N times that of the VCO 14, where N is an integer, the oscillation frequency of the VCO 14 can be established at 2N times that of the VCO 24, offering the same effect as that of the foregoing embodiment 5.

What is claimed is:

1. A PLL circuit comprising a plurality of combinations, each of said combinations comprising:

adjusting means for comparing a phase of an external clock signal with a phase of a frequency divided clock signal, and for adjusting a control voltage in accordance with a phase difference between the two signals compared;

an oscillator for oscillating a single phase clock signal with a frequency corresponding to the control voltage;

a clock generator connected to said oscillator, said clock generator for generating a multiphase clock signal from said single phase clock signal generated by said oscillator, said multiphase clock signal and said single phase clock signal having a same frequency; and a frequency divider for dividing a frequency of the single phase clock signal generated by said oscillator to produce the frequency divided clock signal to be supplied to said adjusting means;

wherein said oscillator in each of said plurality of combinations has a different oscillation frequency.

2. The PLL circuit as claimed in claim 1, wherein said adjusting means in each of said plurality of combinations comprises a low-pass filter for removing noise from said control voltage.

3. A PLL circuit comprising:

first adjusting means for comparing a phase of an external clock signal with a phase of a first frequency divided clock signal, and for adjusting a first control voltage in accordance with a phase difference between the two signals compared;

a first oscillator for oscillating a first single phase clock signal with a frequency corresponding to the first control voltage;

a first clock generator connected to said first oscillator, said first clock generator for generating a first multiphase clock signal from said first single phase clock signal generated by said oscillator, said first multiphase clock signal and said first single phase clock signal having a same frequency;

a first frequency divider for dividing the frequency of the first clock signal generated by said first oscillator to produce the first frequency divided clock signal to be supplied to said first adjusting means;

second adjusting means for comparing a phase of the first single phase clock signal supplied from said first oscillator with a phase of a second frequency divided clock signal, and for adjusting a second control voltage in accordance with a phase difference between the two signals compared;

a second oscillator for oscillating a second single phase clock signal with a frequency corresponding to the second control voltage;

a second clock generator connected to said second oscillator, said second clock generator for generating a second multiphase clock signal from said second single phase clock signal generated by said second oscillator, said second multiphase clock signal and said second single phase clock signal having a same frequency; and a second frequency divider for dividing the frequency of the second single phase clock signal generated by said second oscillator to produce the second frequency divided clock signal to be supplied to said second adjusting means;

wherein said first oscillator and said second oscillator have a different oscillation frequency.

4. The PLL circuit as claimed in claim 3, further comprising one or more combinations, wherein each of said one or more combinations comprises adjusting means, an oscillator and a frequency divider equivalent to said second adjusting means, said second oscillator and second frequency divider, respectively, except that oscillators in said one or more combinations have an oscillation frequency different from each other and different from the oscillation frequencies of said first oscillator and said second oscillator.

5. A PLL circuit comprising:

adjusting means for comparing a phase of an external clock signal with a phase of a frequency divided clock signal, and for adjusting a control voltage in accordance with a phase difference between the two signals compared;

a first oscillator for oscillating a first single phase clock signal with a frequency corresponding to the control voltage;

a first clock generator connected to said first oscillator, said first clock generator for generating a first multiphase clock signal from said first single phase clock signal generated by said oscillator, said first multiphase clock signal and said first single phase clock signal having a same frequency;

a second oscillator for oscillating a second single phase clock signal with a frequency corresponding to the control voltage but different from an oscillation frequency of said first oscillator;

a second clock generator connected to said second oscillator, said second clock generator for generating a second multiphase clock signal from said second single phase clock signal generated by said second oscillator, said second multiphase clock signal and said second single phase clock signal having a same frequency; and a frequency divider for dividing the frequency of the first single phase clock signal generated by said first oscillator to produce the frequency divided clock signal to be supplied to said adjusting means.

6. The PLL circuit as claimed in claim 5, further comprising one or more oscillators, each of which is equivalent to said second oscillator except that said first oscillator, said second oscillator and said one or more oscillators have a different oscillation frequency from each other.

7. The PLL circuit as claimed in claim 5, wherein the oscillation frequency of said first oscillator is tuned to 2N times that of said second oscillator, where N is an integer.

8. The PLL circuit as claimed in claim 5, wherein the oscillation frequency of said second oscillator is tuned to 2N times that of said first oscillator, where N is an integer.

9. The PLL circuit as claimed in claim 1, wherein said clock generator of each of said plurality of combinations further comprises a clock generator frequency divider which produces a signal for output equivalent in phase and frequency to said frequency divided clock signal produced by said frequency divider.

10. The PLL circuit as claimed in claim 3, wherein:

said first clock generator further comprises a first clock generator frequency divider which produces a signal for output equivalent in phase and frequency to said first frequency divided clock signal produced by said first frequency divider; and said second clock generator further comprises a second clock generator frequency divider which produces a signal for output equivalent in phase and frequency to said second frequency divided clock signal produced by said second frequency divider.

11. The PLL circuit as claimed in claim 5, wherein said first clock generator further comprises a clock generator frequency divider which produces a signal for output equivalent in phase and frequency to said frequency divided clock signal produced by said frequency divider.

* * * * *